(12) United States Patent
Tsai et al.

(10) Patent No.: US 11,200,924 B2
(45) Date of Patent: Dec. 14, 2021

(54) METHOD OF MINIMIZING READ-DISTURB-WRITE EFFECT OF SRAM CIRCUIT AND SRAM CIRCUIT THEREOF

(71) Applicant: Taiwan Semiconductor Manufacturing Co., Ltd., Hsinchu (TW)

(72) Inventors: Jui-Che Tsai, Tainan (TW); Chia-En Huang, Hsinchu County (TW); Yu-Hao Hsu, Tainan (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/876,138

(22) Filed: May 18, 2020

(65) Prior Publication Data

US 2021/0098035 A1 Apr. 1, 2021

Related U.S. Application Data

(60) Provisional application No. 62/907,710, filed on Sep. 29, 2019.

(51) Int. Cl.
  *G11C 7/10* (2006.01)
  *G11C 7/12* (2006.01)
  *G11C 7/06* (2006.01)

(52) U.S. Cl.
  CPC ............ *G11C 7/1075* (2013.01); *G11C 7/062* (2013.01); *G11C 7/1012* (2013.01); *G11C 7/1027* (2013.01); *G11C 7/12* (2013.01)

(58) Field of Classification Search
  CPC ....... G11C 7/1075; G11C 7/1012; G11C 7/12; G11C 7/062; G11C 7/1027; G11C 7/02; G11C 8/16; G11C 11/412; G11C 11/419
  See application file for complete search history.

(56) References Cited

U.S. PATENT DOCUMENTS

| | | | |
|---|---|---|---|
| 9,685,210 B1 * | 6/2017 | Ghosh | G11C 7/06 |
| 2016/0027500 A1 * | 1/2016 | Chuang | G11C 8/16 365/154 |
| 2019/0130965 A1 * | 5/2019 | Siddiqui | G11C 11/419 |

OTHER PUBLICATIONS

Y. Ishii et al., "A 28-nm dual-port SRAM macro with active bitline equalizing circuitry against write disturb issue," 2010 Symposium on VLSI Circuits, Jun. 16-18, 2010, pp. 99-100.

(Continued)

*Primary Examiner* — Jay W. Radke
(74) *Attorney, Agent, or Firm* — JCIPRNET

(57) ABSTRACT

In an exemplary embodiment, the disclosure provides a memory circuit which includes a dual port memory cell for storing a binary value accessed through a first port and a second port, a first WL switch connected to the dual port memory cell and controlled by a first WL voltage, a second WL switch connected to the dual port memory cell and controlled by a second WL voltage, a BL connected to the first WL switch for accessing the memory cell through the first port and having a first BL voltage, a second BL connected to the second WL switch for accessing the memory cell through the second port and having a second BL voltage, a BL selection circuit connected to the second WL switch for selecting the second BL, and a BL voltage pull down circuit connected to the BL selection circuit and the second WL switch.

20 Claims, 15 Drawing Sheets

(56) References Cited

OTHER PUBLICATIONS

Cheng-Xin Xue et al., "A 1Mb Multibit ReRAM Computing-In-Memory Macro with 14.6ns Parallel MAC Computing Time for CNNBased AI Edge Processors," 2019 IEEE International Solid-State Circuits Conference (ISSCC), Feb. 20, 2019, pp. 388-390.
Hidehiro Fujiwara et al., "A 7nm 2.1GHz Dual-Port SRAM with WL-RC Optimization and Dummy-Read-Recovery Circuitry to Mitigate Read-Disturb-Write Issue," 2019 IEEE International Solid-State Circuits Conference (ISSCC), Feb. 20, 2019, pp. 390-392.
Inhak Lee et al., "A Voltage and Temperature Tracking SRAM Assist Supporting 740mV Dual-Rail Offset for Low-Power and High-Performance Applications in 7nm EUV FinFET Technology," 2019 IEEE International Solid-State Circuits Conference (ISSCC), Feb. 20, 2019, pp. 392-394.
Jun Yang et al., "Sandwich-RAM: An Energy-Efficient In-Memory BWN Architecture with Pulse-Width Modulation," 2019 IEEE International Solid-State Circuits Conference (ISSCC), Feb. 20, 2019, pp. 394-396.
Xin Si et al., "A Twin-8T SRAM Computation-In-Memory Macro for Multiple-Bit CNN-Based Machine Learning," 2019 IEEE International Solid-State Circuits Conference (ISSCC), Feb. 20, 2019, pp. 396-398.

\* cited by examiner

METHOD OF MINIMIZING READ-DISTURB-WRITE EFFECT OF SRAM CIRCUIT AND SRAM CIRCUIT THEREOF

CROSS REFERENCE TO RELATED APPLICATION

This application claims the priority benefit of U.S. provisional application Ser. No. 62/907,710 filed on Sep. 29, 2019. The entirety of the above-mentioned patent application is hereby incorporated by reference herein and made a part of specification.

BACKGROUND

Currently, the read-disturb-write (RDW) effect is a known phenomenon that occurs in a memory circuit in which a read or a write operation performed in a cell would inadvertently lead to a write operation performed in a neighboring cell. The read-disturb-write effect could be a problem to be resolved for various types of memory circuits. In order to elucidate the read-disturb-write effect, refer to FIG. 1 which shows a typical dual port memory circuit having such effect. The dual port memory circuit of FIG. 1 includes multiple dual port memory cells with each cell containing two different ports. The dual port memory circuit of FIG. 1 has multiple bit lines and multiple word lines, and each bit line (BL) is controlled by a corresponding word line (WL). Each cell may be accessed by two BLs (e.g. ABL and BBL) which may store one binary value, and may also be connected to two complimentary bit lines (ABL bar (ABLB) and BBL bar (BBLB)) which access the complimentary binary values of the two BLs. For example, a first memory cell 101 has ABL[1] controlled by AWL[1] and BBL[1] controlled by BWL[1] and a second memory cell 102 has ABL[2] controlled by AWL[1] and BBL[2] controlled by BW[1].

The RDW effect may occur between cells of the same WL when performing a same row different column (SRDC) access, wherein some cells of a row in a first set of columns may be selected for access via the first port corresponding to ABL and ABLB while other cells of the same row but in a set of columns different from the first set are selected for access via the second port corresponding to BBL and BBLB. Since a WL is connected to multiple cells, a WL which is turned on to select one cell would also turn on other cells. When a WL is selected to perform a read or a write operation on target cells of a row via the first port, a cell accessed by an activated BL corresponding to the first port may be referred to as a selected cell relative to the first port, and a cell not accessed via the first port by an activated BL may be referred to as a half-selected cell. For example, suppose that AWL[1] and ABL[2] are activated to perform a read or a write operation, the cell is a selected cell relative to the first port comprising transistor Q2 while the same cell connected to BWL[1] and BBL[2] is a half selected cell relative to the second port comprising transistor Q1. For example, suppose that BWL[1] and BBL[1] are activated to perform a read or a write operation on memory cell 101, the cell is a selected cell (e.g., a region of the memory cell 101 having darker shading) relative to the second port while the cell connected to AWL[1] and ABL[1] is a half selected cell (e.g., a region of memory cell 101 having a lighter shading) relative to the first port. By the same principle, the cell on the left of the first memory cell 101 may be a half selected cell relative to its first and/or second port.

The RDW effect may occur during the SRDC access when performing a read or a write operation on a selected cell, thus leading to a half-selected cell of the same row being written. For example, as seen in FIG. 1, when AWL is set 'high (H)' (i.e. high voltage) and BWL is 'H', the RDW current 103 follows from BBL which is 'IT through the Q1 and Q2 transistor to the ABL which is set low ('L'). Thus, the access to the B port which is the aggressor corresponding to the selected cell may inadvertently cause a half-selected cell of the A port which is the victim to be written.

The worst-case scenario may occur when an aggressor WL is turned on after a victim WL, and such scenario is shown in FIG. 2A and FIG. 2B. FIG. 2A and FIG. 2B show the same circuit and the same waveform except FIG. 2A highlights the second phase when AWL is set 'H' and FIG. 2B highlights the third phase when AWL is set I'. As shown in FIG. 2A, during the first phase after AWL is set 'H' and ABL is pulled 'L', the MT node voltage would go low while the MB node voltage would ramp up. During the second phase after the BWL is set 'H' while BBL is clamped 'H', there could be a second phase bump 201. During the third phase after AWL is set 'L' while BWL and BBL remain 'H', there could be a third phase bump 202. Recently it has been shown that the second phase bump 201 and the third phase bump 202 may affect the RDW effect, and the gap 203 between the MT node voltage and MB voltage as shown in FIG. 2B may affect the RDW effect as maximizing the gap 203 between the MT voltage and MB voltage may lead to an improvement of the RDW effect.

FIG. 3 illustrates an existing solution to mitigate the $3^{rd}$ phase bump. Instead of clamping the BBL voltage high, one solution could be to turn off the BBL voltage clamp when ABL is set 'L' during a write operation. By turning off the BBL voltage clamp, the BBL voltage would be left floating which leads to a slow decay of the BBL voltage during the second phase due to the poor discharge slew rate of the BBL voltage. However, it has been shown that the gap 203 between the MT voltage and MB voltage would still be small although such endeavor would mitigate the third phase bump 202. Therefore, the current solution is still inadequate for minimizing the RDW effect.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
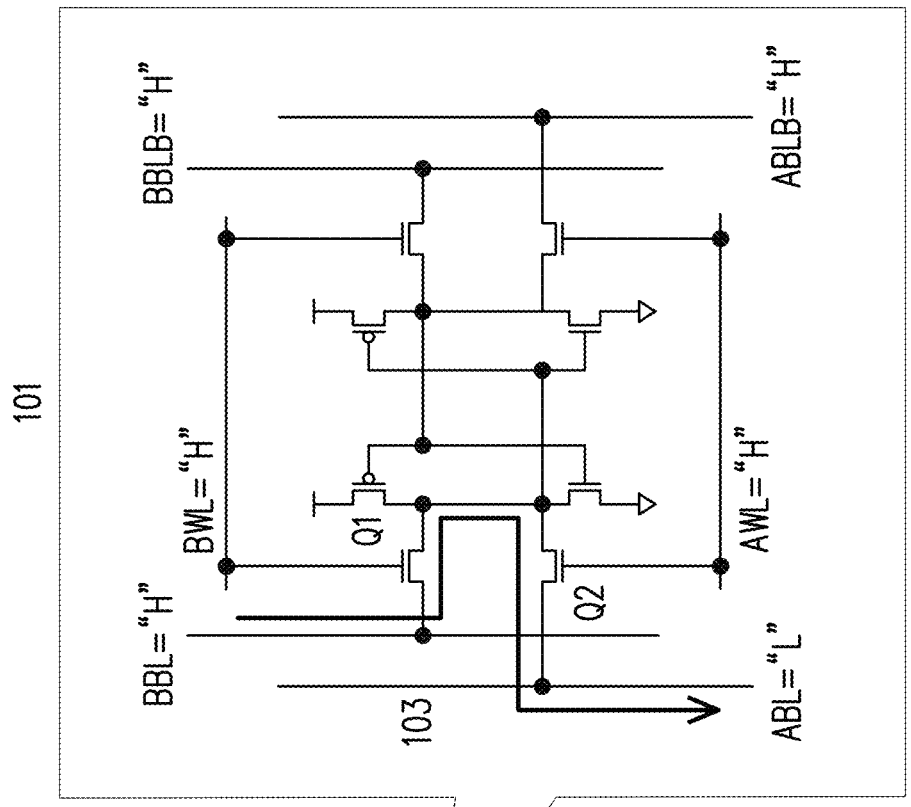
FIG. 1 illustrates a dual port memory circuit having a read-disturb-write effect.
Figure 1:
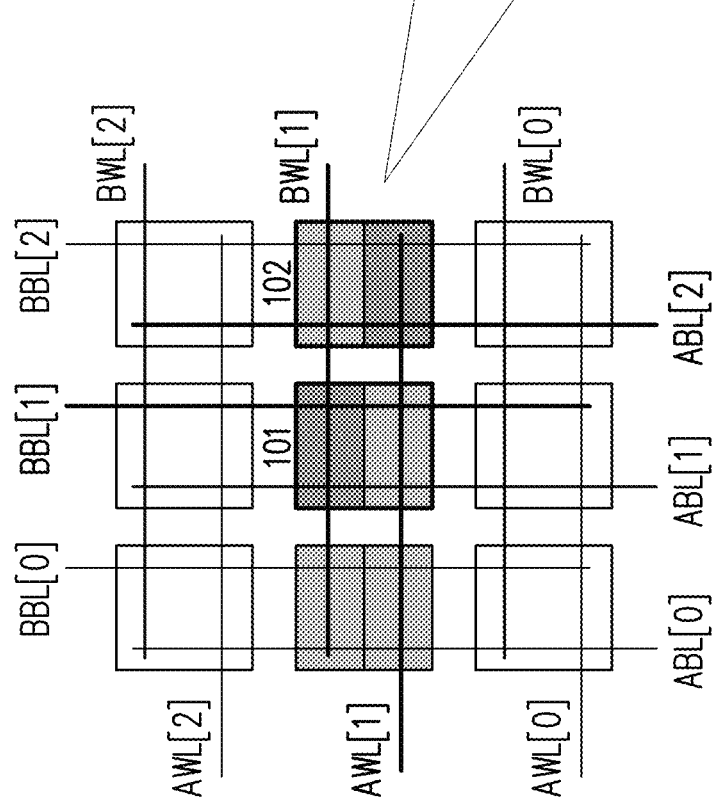
Figure 2A:
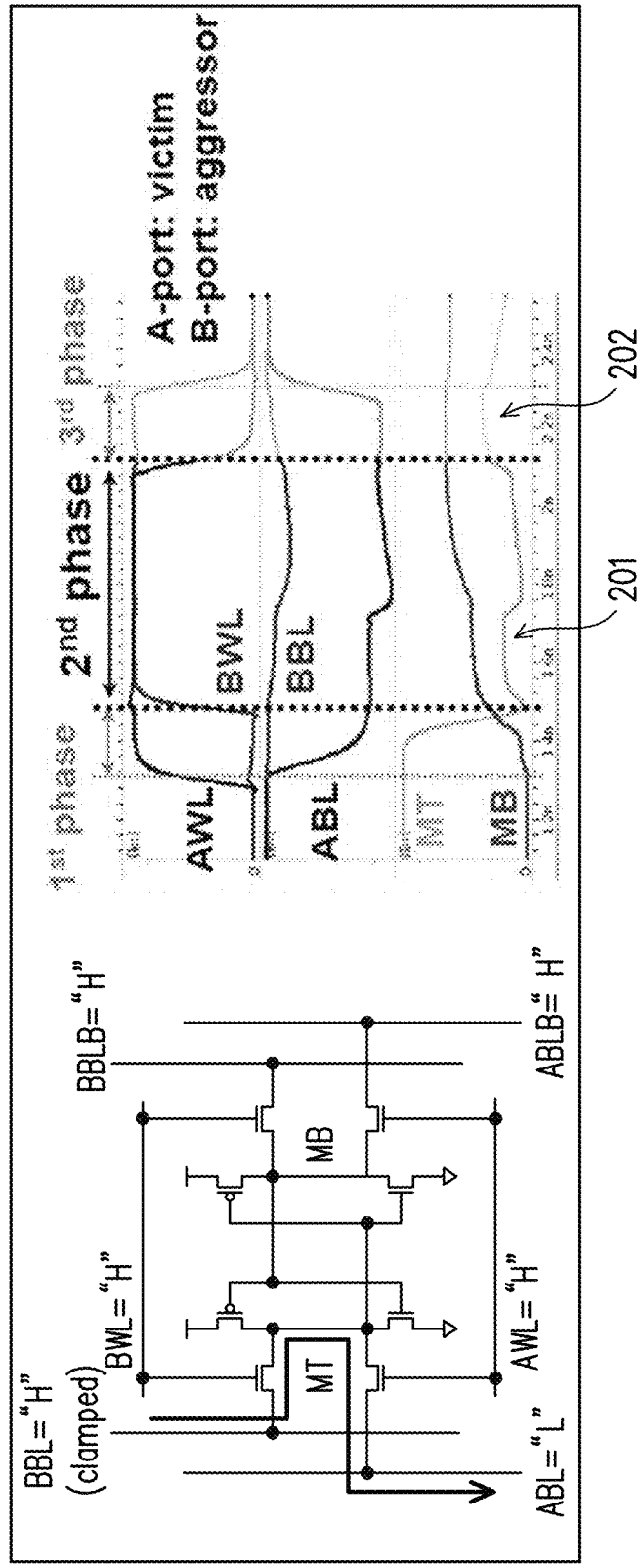
FIG. 2A illustrates multiple phases of a voltage over time plot of a dual port memory circuit highlighting the second phase.
Figure 2B:
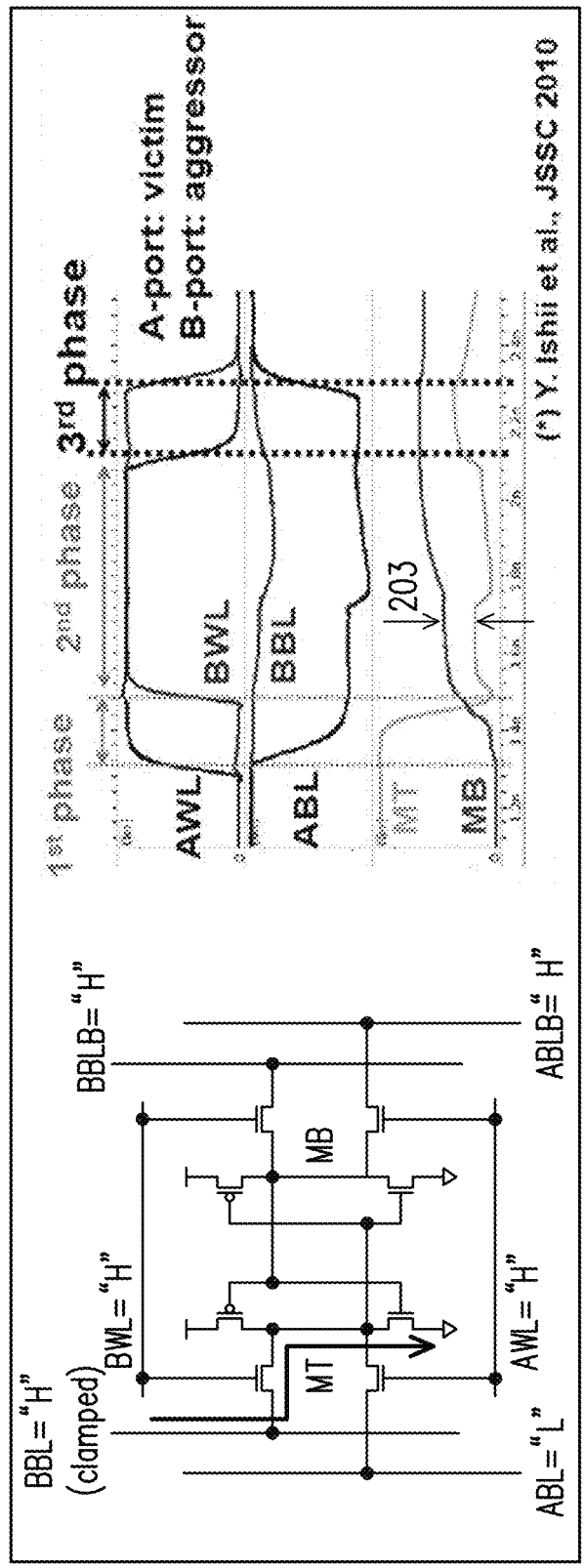
FIG. 2B illustrates multiple phases of a voltage over time plot of a dual port memory circuit highlighting the third phase.
Figure 3:
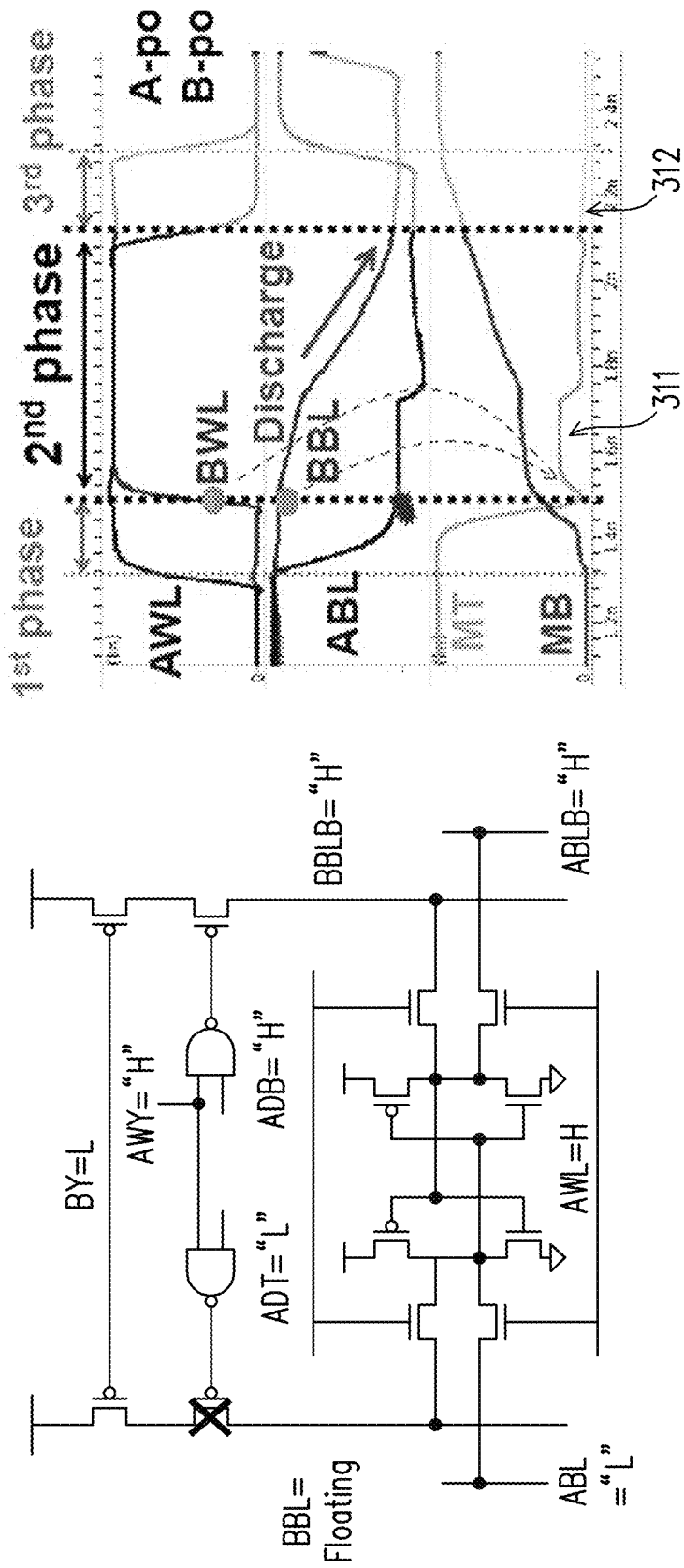
FIG. 3 illustrates an existing solution to mitigate the $3^{rd}$ phase bump so as to minimize the RDW effect.

Reference will now be made in detail to the present exemplary embodiments of the disclosure, examples of which are illustrated in the accompanying drawings. Wherever possible, the same reference numbers are used in the drawings and the description to refer to the same or like parts.

In order to further minimize the above described RDW effect in a dual port memory circuit, the disclosure provides a memory circuit, a method for minimizing the RDW effect, and an electronic device containing such memory circuit. Even though a static random access memory (SRAM) type of device is used to illustrate the inventive concepts and as exemplary embodiments of the disclosure, it would be apparent to an ordinary person skilled in the art that the same concepts may also be applicable to some other types of memory devices, similar types of memory devices, or other variations of the SRAM type of memory devices.

The disclosure minimizes the effect of the RDW problem of a dual port memory device by reversing the role of a second port from being an aggressor of the effect on a first port to an assistor at minimizing such effect. The reversal of the role could be accomplished by using a far-end idle write driver of the second port (e.g. B port) to improve the alpha ratio (pass gate (PG) pull up (PU) ratio) of the first port (e.g. A port) during a write operation of the SRDC situation so as to mitigate the active power or active area drawback of the negative bit line (NBL) scheme especially for high-density dual port memory device and to enhance pulling down the Vmin of SRDC in order to increase the speed of the SRDC access.

The disclosure minimizes the RDW effect through a combination of various means which may include providing an extra write driver path by the second port to improve the write ability of a memory cell, to further reduce the bitcell internal node bump when the second port (e.g. BBL) is turned on, to enlarge the bitcell internal node gap (e.g. gap between MT and MB) when a write assist circuit has been turned, to reduce the penalty associated with the write assist circuit, to act by considering different dual port assess conditions such as by turning off an extra write driver path in a non-worst write case in order to avoid a write conflict in the second port, to adopt OAI logic and share the existing device to reduce design overhead, to leverage an un-used second port write driver to play the role of a far-end write assist (FEWA) function to minimize a hi-BLR issue which could be critical for scaling in N3 and beyond, and so forth.

Figure 4:
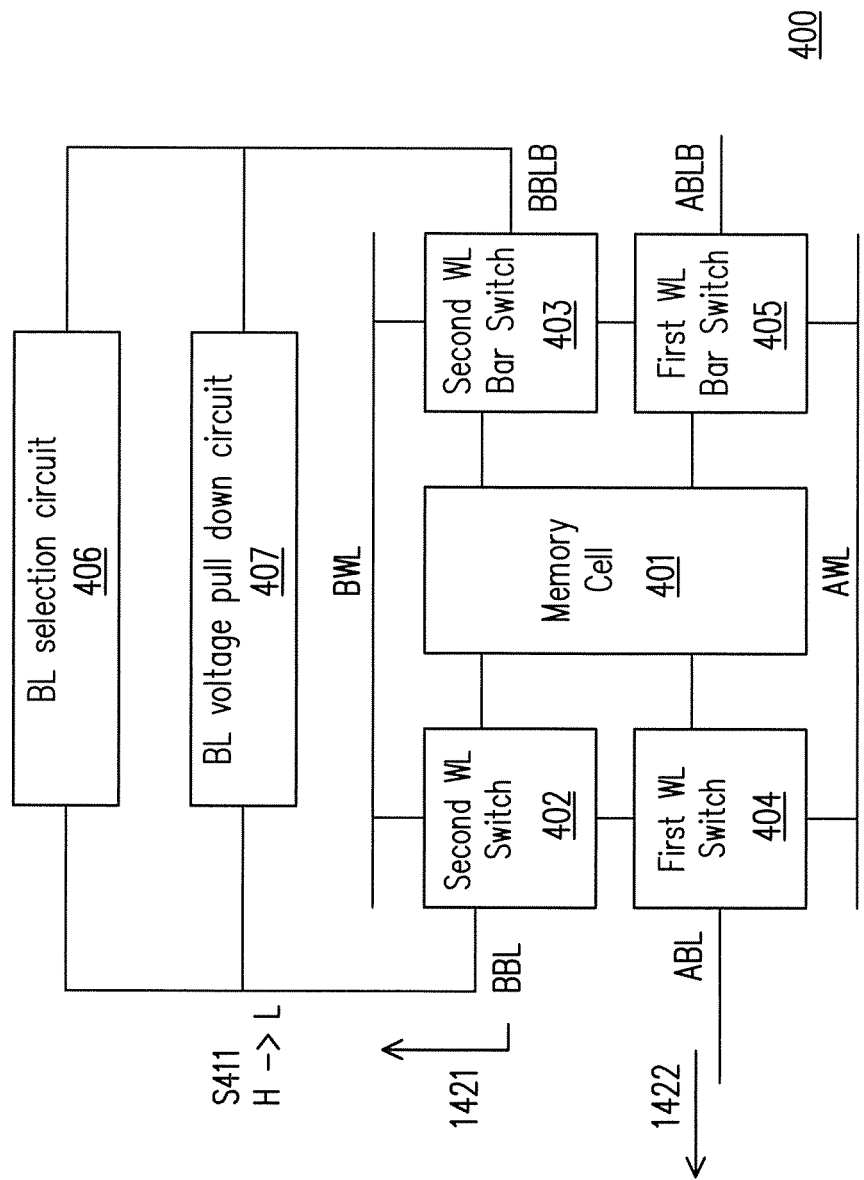
FIG. 4 illustrates a hardware block diagram of a memory circuit in accordance with an exemplary embodiment of the disclosure.

FIG. 4 illustrates a hardware block diagram of an electronic device containing a memory device which contains the memory circuit 400. Conventionally, an electronic device such as a personal computer (PC), a laptop, a mobile phone, and so forth may include a central processor (CPU) which is connected to a memory controller which is connected to a memory controller which is connected to a memory device which contains the memory circuit 400. According to an exemplary embodiment of the disclosure, the memory circuit 400 may include a dual port memory cell 401 for storing a binary value which is accessed through a first port and a second port, a first WL switch 404 connected to the dual port memory cell 401 and controlled by a first WL (AWL) voltage, a second WL switch (402) connected to the dual port memory cell (401) and controlled by a second WL voltage (BWL) voltage, a first BL (ABL) connected to the first WL switch (404) for accessing the memory cell (401) through the first port and having a first BL (ABL) voltage, a second BL (BBL) connected to the second WL switch (402) for accessing the memory cell (401) through the second port and having a second BL (BBL) voltage, a BL selection circuit (406) connected to the second WL switch (402) for selecting the second BL (BBL), and a BL voltage pull down circuit (407) connected to the BL selection circuit (406) and the second WL switch (402) and configured to pull down the second BL (BBL) voltage, wherein during a write operation, the first BL (ABL) voltage is pulled from high (e.g. voltage to turn on a write driver) to low (e.g. ground or reference voltage), and the BL voltage pull down circuit (407) is configured to pull the second BL (BBL) voltage from high (e.g. voltage to turn on the transistor such as T1) to low (e.g. ground or reference voltage) before the second WL (BWL) voltage is pulled high.

According to an exemplary embodiment, the BL voltage pull down circuit 407 could be configured to generate a write assist current (1421) flowing from the second WL switch (402) to the BL voltage pull down circuit (407) so as to pull the second BL (BBL) voltage from high to low before the second WL (BWL) voltage is pulled high. The write assist current (1421) generated by the BL voltage pull down circuit (407) could be configured to at least double the pull gate pull up (PG/PU) ratio (i.e. alpha ratio) of the memory cell 401. During the write operation, a write current (1422) of the first port is flowing from the first WL switch (AWL) to the first BL (ABL) as the write assist current (1421) is flowing from the second WL switch (402) to the BL voltage pull down circuit (407). The write current (1422) of the first port could be assisted by an idle transistor from a second port of another column.

According to an exemplary embodiment, the memory circuit 400 may further include a comparator circuit (e.g. 702) connected to the BL voltage pull down circuit (407) and configured to receive a first address (e.g. address-A) of the first port and a second address (e.g. Address-B) of the second port for determining whether the write operation is a same row different column (SRDC) access based on comparing the first address with the second address. The comparator circuit may include an output (e.g. RCPBY) which outputs a first binary value to pull the second BL (BBL) voltage low only in response to the comparator circuit having determined the write operation is the SRDC access, and the comparator outputs a second binary value which leaves the second BL voltage floating in response to the comparator having determined that the write operation is not the DRDC access. The BL voltage pull down circuit (407) may further include a first transistor (e.g. T1) connected to the second WL switch (402) (e.g. T22) and a third transistor (e.g. T3) of the BL selection circuit (406) and a first NOR gate (e.g. N1) connected to the first transistor and including a first NOR gate input and a second NOR gate input, and is configured to control the first transistor based on a NOR operation between the first NOR gate input and the second NOR gate input, wherein the first NOR gate input is connected to a fourth transistor (e.g. T4) of the BL selection circuit (406) and the second NOR gate input is connected to the output of the comparator circuit.

According to an exemplary embodiment, the BL voltage pull down circuit may further include a second transistor (e.g. T2) connected to the fourth transistor of the BL selection circuit (406) and a second BL bar switch (403) and a second NOR gate (N2) connected to the first transistor, having a third NOR gate input and a fourth NOR gate input, and is configured to control the second transistor based on a NOR operation between the third NOR gate input and the fourth NOR gate input, where the third NOR gate input is connected to the third transistor of the BL selection circuit (407) and the fourth NOR gate input is connected to the output of the comparator circuit. In response to the output of the comparator circuit being the first binary value (e.g. '0'), the first transistor is turned on to set the second BL (BBL) voltage low (e.g. '0') and the second transistor is set floating to set a second BL complement (BBLB) voltage high (e.g. '1').

Figure 5:
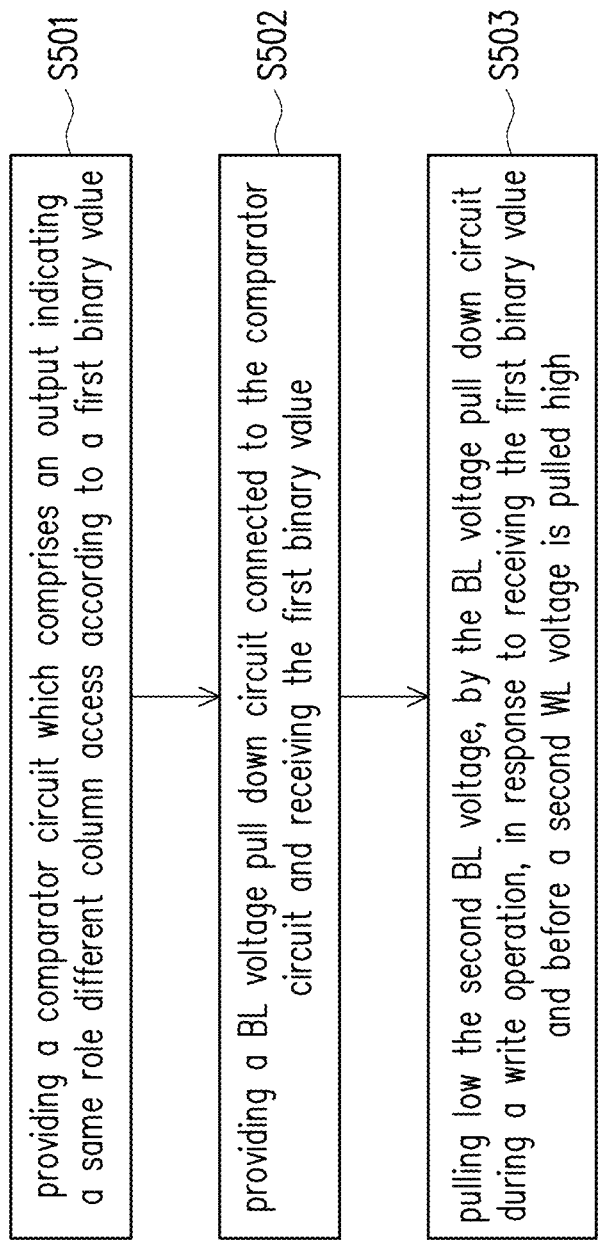
FIG. 5 illustrates a method of minimizing an RDW effect of a memory circuit in accordance with an exemplary embodiment of the disclosure.

FIG. 5 illustrates a method of minimizing an RDW effect of a memory circuit (e.g. 400) in accordance with an exemplary embodiment of the disclosure. In step S501, the memory circuit may provide a comparator circuit which has an output that indicates whether a SRDC access is being applied according to a first binary value (e.g. '0') of the output of the comparator circuit. In step S502, the memory circuit may utilize a BL voltage pull down circuit which is connected to the rest of the memory circuit and receives the first binary value from the output from the comparator circuit. In step S503, the memory circuit may pull from high to low the second BL (e.g. BBL) voltage by using the BL voltage pull down circuit during a write operation in response to receiving the first binary value and before a second WL (e.g. BWL) voltage is pulled high.

According to one of the exemplary embodiments of the disclosure, the method may further include generating, by the BL voltage pull down circuit, a write assist current flowing from the second WL switch to the BL voltage pull down circuit so as to pull the second BL voltage from high to low before the second WL voltage is pulled high, configuring the write assist current generated by the BL voltage pull down circuit to double the pull gate pull up (PG/PU) ratio of the memory cell, and assisting the write current of the first port by using an idle transistor from a second port of another column.

Figure 6:
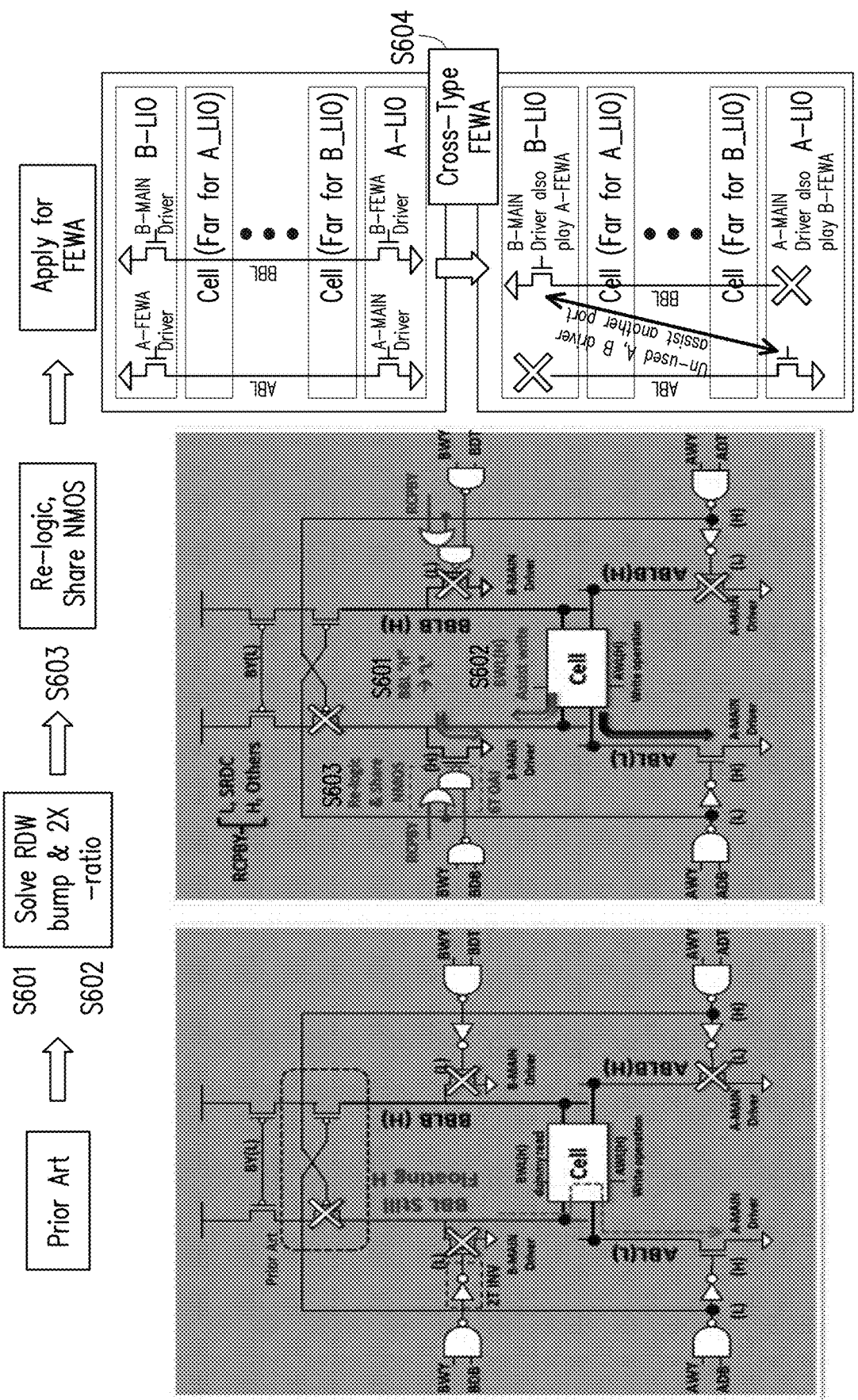
FIG. 6 illustrates various inventive concepts in accordance with an exemplary embodiment of the disclosure.

FIG. 6 illustrates a summary of various inventive concepts in accordance with an exemplary embodiment of the disclosure. The inventive concepts include four main elements which including (1) minimizing the effect of the RDW (S601) by setting the BBL from high to low before the BWL is turned on, (2) at least doubling the PG/PU ratio (i.e. alpha ratio) of the memory circuit (S602), (3) adding logic circuits to control the read or write operation such as by sharing the NMOS transistors between the BL voltage pull down circuit (e.g. 407) and the BL selection circuit (e.g. 406) (S603), and (4) providing a far end write assist (FEWA) mechanism which involves using a far end idle driver of another column to assist the write current of another port. In other words, a first memory cell may use an idle transistor of a B port of a second memory cell of another column to assist the write current of A port of the first memory cell and vice versa. The details of the above described inventive concepts will be further described in the following exemplary embodiments.

Figure 7:
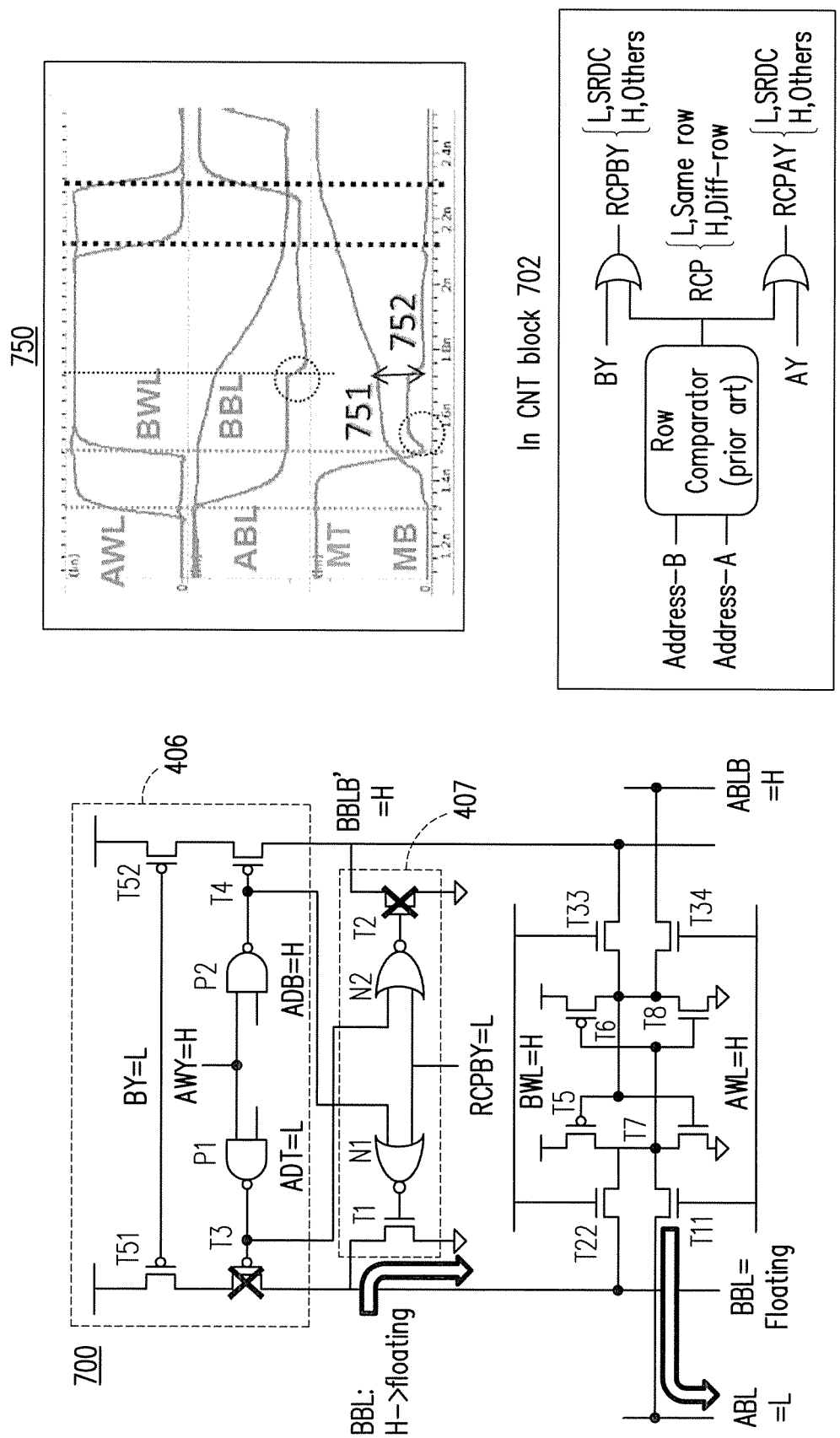
FIG. 7 illustrates a BL voltage pull down circuit in accordance with an exemplary embodiment of the disclosure.

FIG. 7 illustrates a memory circuit 700 having the BL voltage pull down circuit (e.g. 407) in accordance with an exemplary embodiment of the disclosure. First, the physical structure of the memory circuit 700 is described. In this memory circuit, transistors T5, T6, T7, and T8 form the SRAM latch (i.e. memory cell 401) for storing a binary bit. The transistor T11 could be an embodiment of the first WL switch 404, the transistor T22 could be an embodiment of the second WL switch 402, the transistor T33 could be an embodiment of the second WL bar switch 403, and the transistor T34 could be an embodiment of the first WL bar switch 405. The BL voltage pull down circuit would include a first transistor T1, a second transistor T2, a first NOR gate N1, and a second NOR gate N2. The first transistor T1 is controlled by the output of the first NOR gate N1 which has a first NOR gate input connected to an output (RCPBY) of the CNT block 702 and a second NOR gate input connected to a gate of the transistor T4 of the BL selection circuit (e.g. 406). The second NOR gate N2 has a third NOR gate input connected to a gate of the transistor T3 of the BL selection circuit (e.g. 406) and a fourth NOR gate input connected to the output (RCPBY) of the CNT block 702. The second NOR gate output is connected to the fourth NOR gate output.

The memory circuit 700 would further include a BL selection circuit (406) which may include a third transistor T3, a fourth transistor T4, a first NAND gate P1, a second NAND gate P2, a first bias transistor T51 and a second bias transistor T52. The first bias transistor T51 is connected to the third transistor T3 for providing the bias voltage, and the second bias transistor T52 is connected to the fourth transistor for providing the bias voltage. The third transistor T3 is controlled by the output of the first NAND gate which receives the AWY input and the ADT input and provides a result of the NAND operation to control the third transistor T3 based on the AWAY input and the ADT input. The fourth transistor T4 is controlled by the output of the second NAND gate which receives the AWY input and the ADB input and provides a result of the NAND operation to control the fourth transistor T4 based on the AWAY input and the ADT input.

The memory circuit 700 may further include a CNT block 702 which functions as the above described comparator circuit. The CNT block 702 may include a row comparator which receives a first address (e.g. address-A) and a second address (e.g. address-B). Based on the first address and the second address, the comparison would determine whether the first address and the second address are the same row or a different row. The output (RCP) of the comparator would be a logical (or binary) high if the first address and the second address are different rows and would be a logical (or binary) low if the first address and the second address are the same rows.

The output (RCP) would be sent to an OR gate with the BY input to generate a RCPBY output which is sent as the inputs of the first NOR gate N1 and the second NOR gate N2. The RCPBY would indicate a digital (or binary) low voltage if the operation is the SRDC access or a digital (or binary) high voltage if the operation is not the SRDC access.

Figure 8:
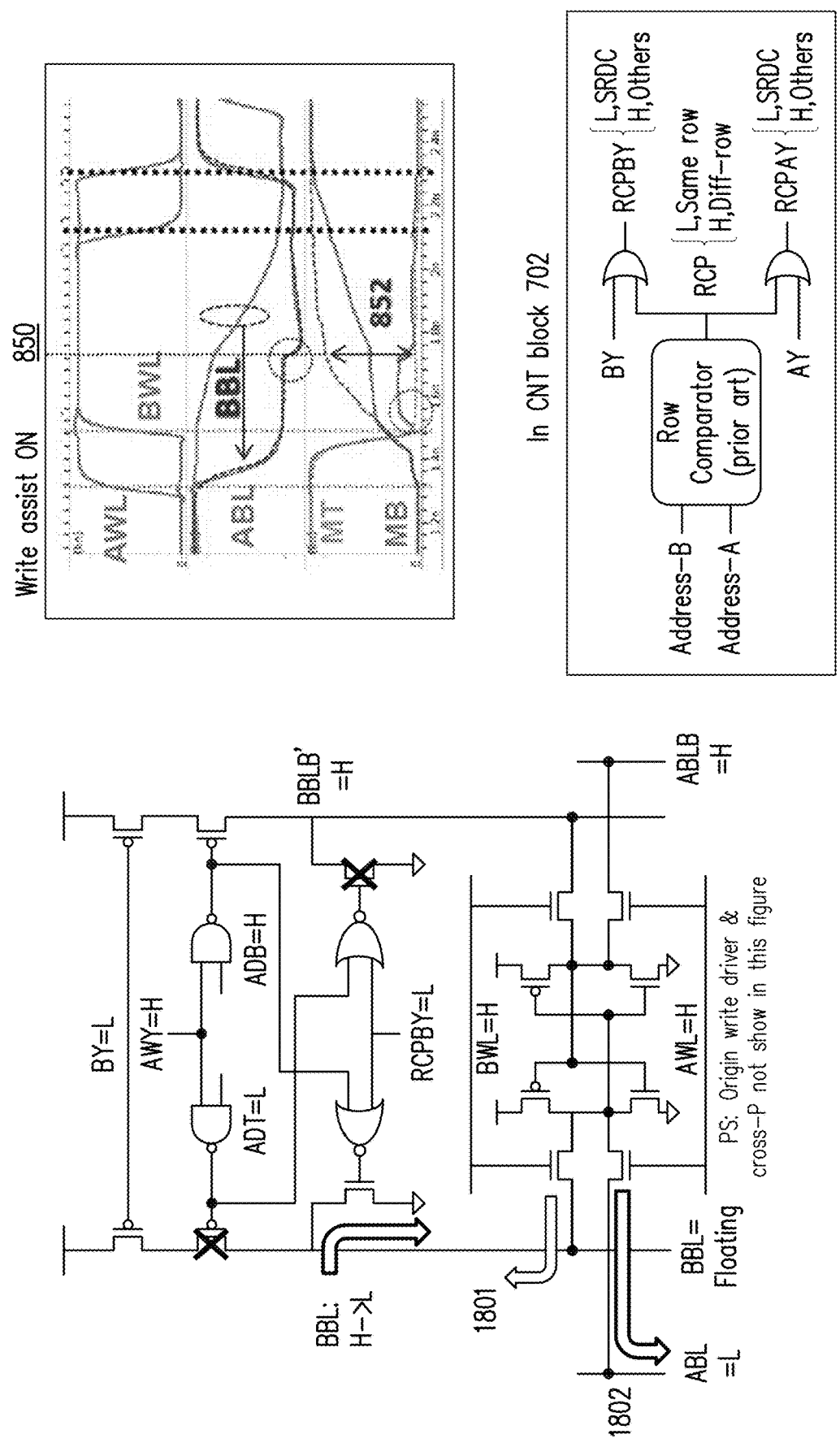
FIG. 8 illustrates the effect of the BL voltage pull down circuit in accordance with an exemplary embodiment of the disclosure.

The principle of operation of memory circuit 700 is described as follows. In the voltage diagram 750 of a conventional memory circuit 700 without implementing the inventive concepts of the disclosure, the BBL voltage experiences a slow decay as the BBL is changed from a high voltage to a floating state by turning off the third transistor T3. As seen from the voltage diagram 750, the MT bump 751 still exists and the gap 752 between MB and MT is narrowed due to the MT bump 751. However as shown in FIG. 8 which depicts the same circuit as FIG. 7 but the voltage diagram 850 shows an improvement as the result of the inventive concept being implemented. Upon receiving the low voltage from the RCPBY (or RCPAY for A port) output from the CNT block 702, the first NOR gate N1 is configured to turn on the T3 transistor which sets the BBL voltage from high to low before BWL is turned out. By doing such, an extra driver current path I801 is created and flows from the transistor T22 toward the T1 transistor to assist the write current I802 flowing from the T11 transistor toward the write driver along the ABL. The extra write driver path (I801) makes the BBL does an early write which occurs before the BWL, the same as the ABL.

The result of the embodiment of FIG. 8 is shown in the voltage diagram 850 which shows that the BBL voltage waveform is no longer left to decay but behaves in a similar manner as the ABL voltage waveform, and there is a lot less MT bump and a bigger gap 852 between MB and MT as the result of the MB voltage being higher. The increase of the gap 852 has the effect of an improved write ability and a reduction of the write assist penalty. The voltage diagram 850 shows that the extra write driver path (I801) would help the BBL voltage to be pulled from high to low faster and thus reduce the RDW effect and enhance the write ability of the A port.

Figure 9:
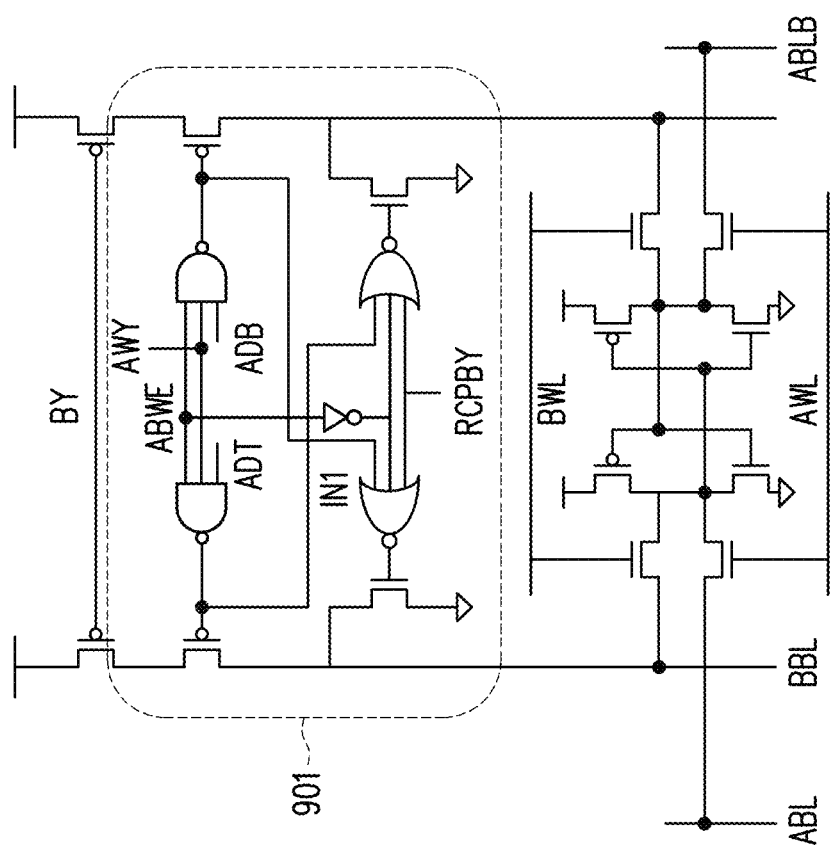
FIG. 9 illustrates a first alternative of the BL voltage pull down circuit in accordance with an exemplary embodiment of the disclosure.

It is worth noting that the BL voltage pull down circuit (e.g. 407) may have different implementations. As an exemplary embodiment, FIG. 9 shows a first alternative of the BL voltage pull down circuit 901. The first alternative of the BL voltage pull down circuit 901 is similar to the BL voltage pull down circuit 407 of FIG. 4 and FIG. 7 and thus a description of same structure and the principle operation is not repeated. The addition to the BL voltage pull-down circuit 901 include a ABWE input to the first NAND gate and to the second NAND gate and thus the first NAND gate contains three inputs including the AWY, ABWE, and ADT, and the second NAND gate contains three inputs including AWY, ABWE, and ADB. Furthermore, the ABWE is also connected to the first NOR gate and the second NOR gate through the inverter IN1 as a third input. Thus, the added ABWE signal may turn on the first transistor T1 and turn off the third transistor T3 if the ABWE signal is set high or may turn off the first transistor T1 and turn on the third transistor T3 if the ABWE signal is set low. If the first transistor T1 and the fourth transistor is turned on, the second transistor T2 and the third transistor T3 are turned off, and vice versa.

Figure 10:
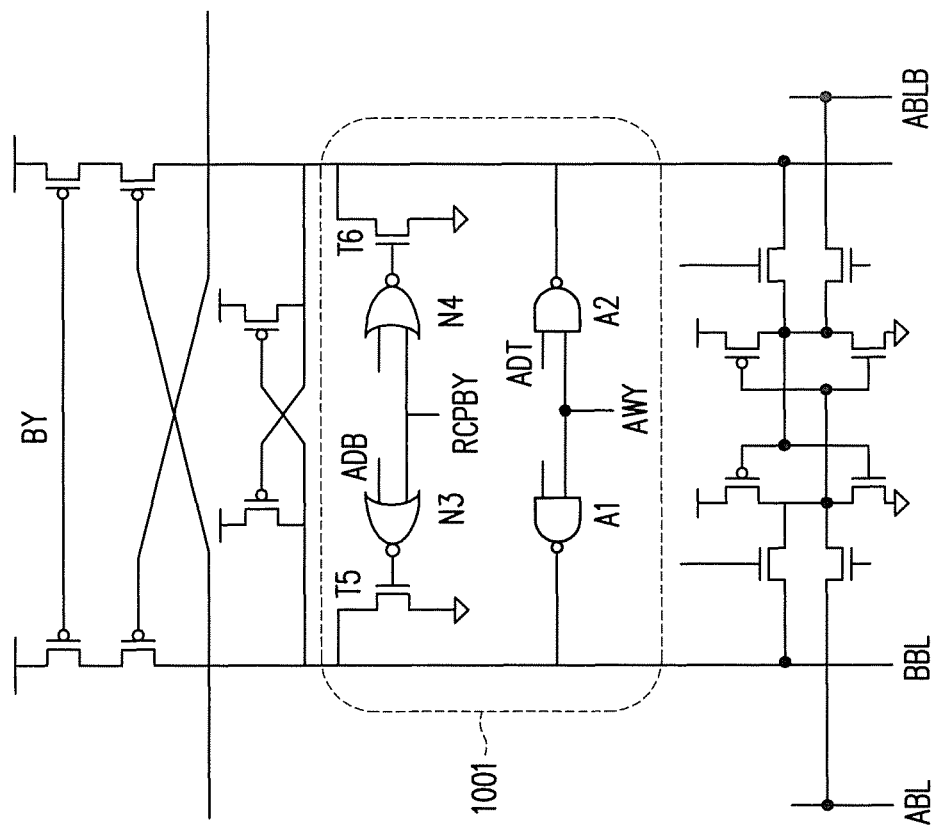
FIG. 10 illustrates a second alternative of the BL voltage pull down circuit in accordance with an exemplary embodiment of the disclosure.

As an exemplary embodiment, FIG. 10 shows a second alternative of the BL voltage pull down circuit 1001. For this exemplary embodiment, the second alternative of the BL voltage pull down circuit 1001 includes a fifth transistor T5 controlled by the output of the third NOR gate N3 which is connected to a first AND gate A1 and a sixth transistor T6 controlled by the output of the fourth NOR gate N4 which is connected to a second AND gate A2. The principle of operation of the fifth transistor T5 and the sixth transistor T6 are identical to the first transistor T1 and the second transistor T2 of FIG. 7~FIG. 9. The third NOR gate N3 receives an input of a control signal and the output of the first AND gate A1, and the fourth NOR gate N4 receive an input of a control signal and the output of the second AND gate A2. For example, the third NOR gate may receive the output of the PCPBY signal and the first AND gate A1 may receive a NAND operation of the ADB and AWY signals (or a NAND operation of the BDB and BWY signals), and the fourth NOR gate may receive the output of the PCPBY signal and the second AND gate A2 may receive a NAND operation of the ADT and AWY signals (or a NAND operation of the BDT and BWY signals). The concept is similar to the exemplary embodiment of FIG. 8 except the logic is implemented differently.

Figure 11:
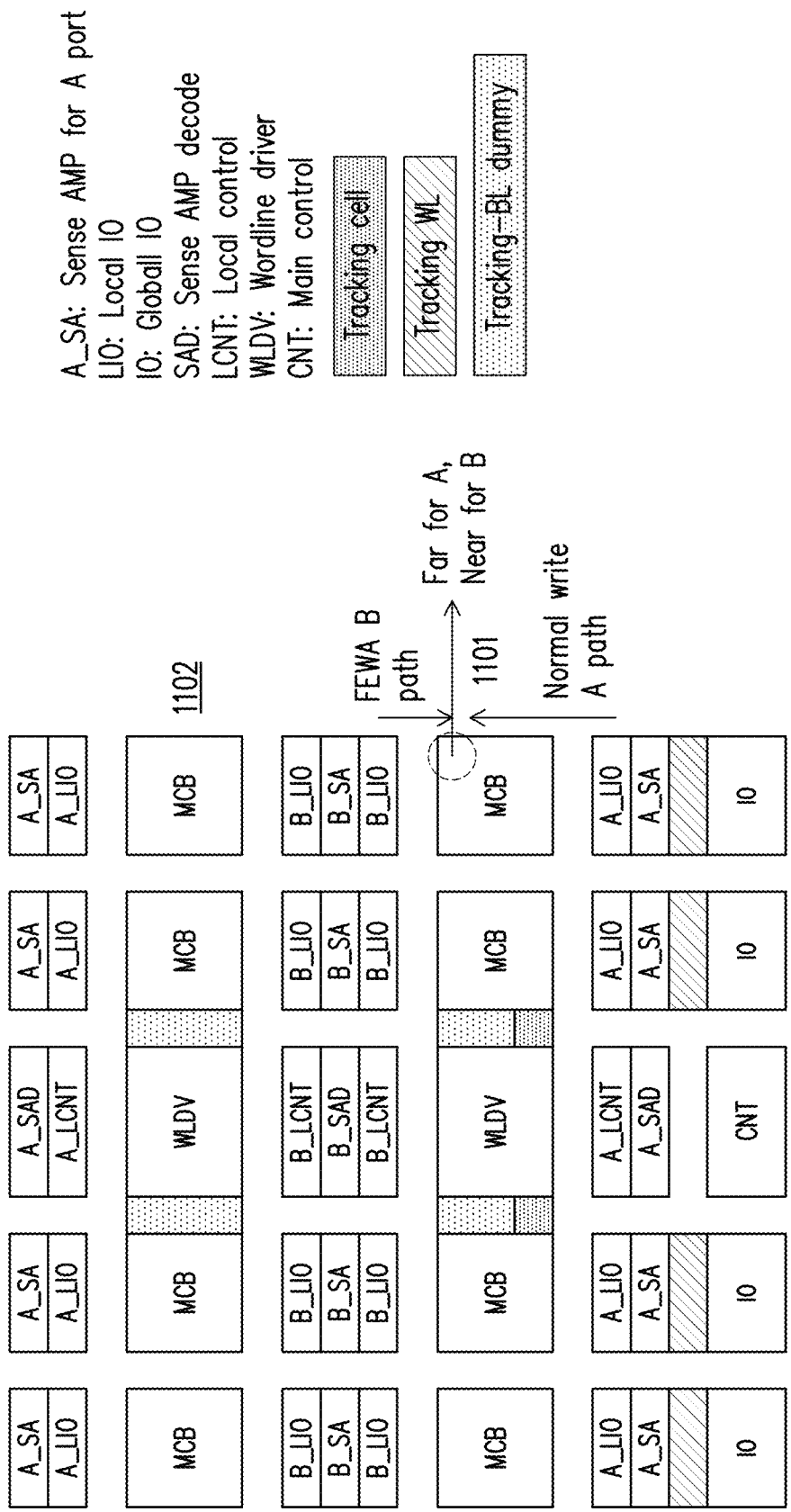
FIG. 11 illustrates a layout for improving high BLR issue in advance processor node in accordance with an exemplary embodiment of the disclosure.

FIG. 11 illustrates a layout for improving high BLR issue in advance processor node in accordance with an exemplary embodiment of the disclosure. In FIG. 9, the MCB block 1101 includes a plurality of memory cells, and the MCB block 1102 also include a plurality of memory cells. The key is that the local IO for A port (A_LIO) is and the local IO for B port (B_LIO) layouts are placed in opposite locations which allows the extra write drive path (i.e. I801) to be treated as a far-end write assist (FEWA) function. In other words, assuming that the A port of the MCB block 901 has a far write path while the B port of MCB block 902 has a near write path, the extra write drive path would be able to assist the write function of the A port of the MCB block 901.

Figure 12:
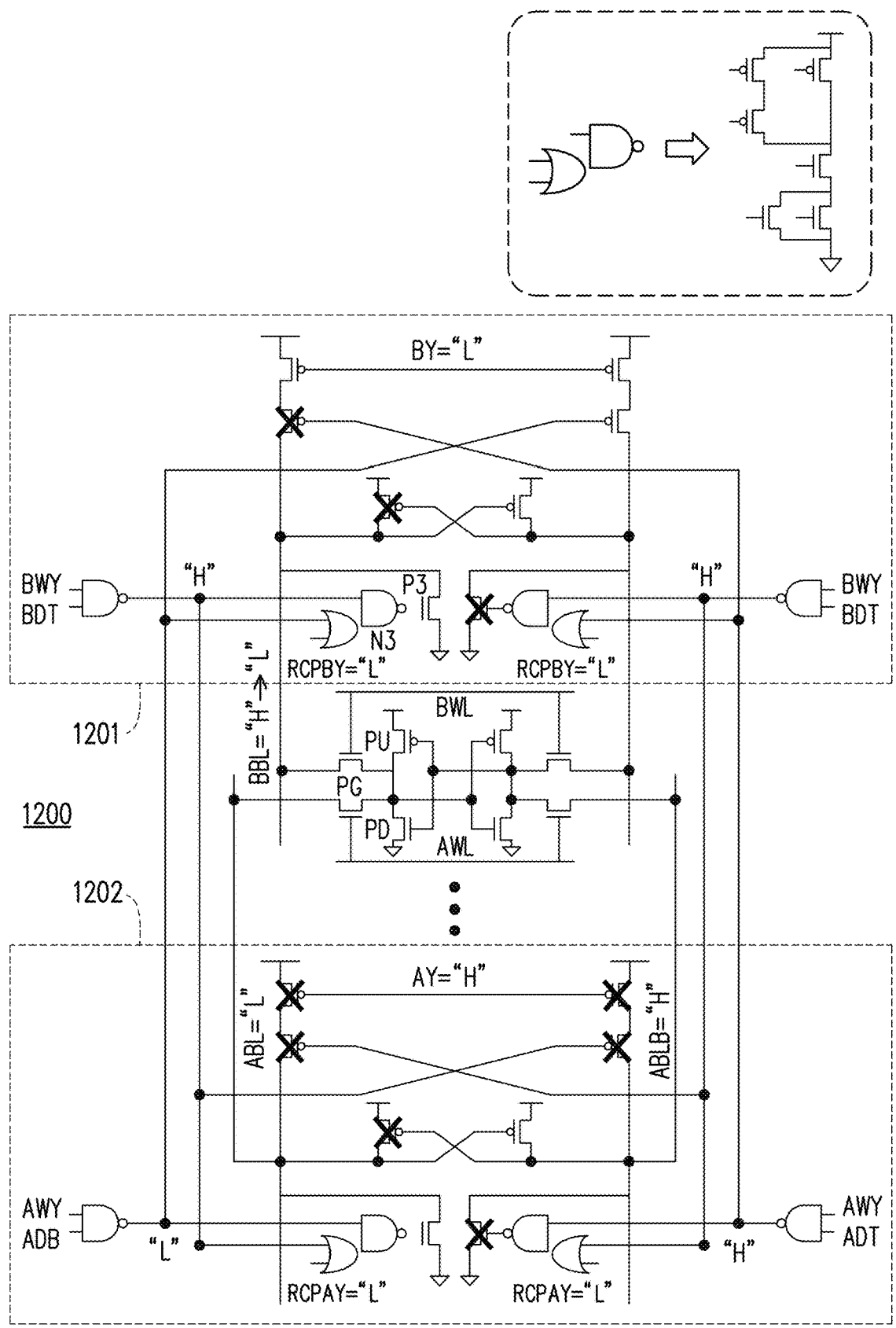
FIG. 12 illustrates a circuit with FEWA function in accordance with an exemplary embodiment of the disclosure.

As an exemplary embodiment, a memory circuit with FEWA function is shown in FIG. 12. The memory circuit 1200 of FIG. 12 is similar to the embodiment of FIG. 8 but it shows a BL selection circuit and a BL voltage pull down circuit for both the B port 1201 and the A port 1202. The concept of this exemplary embodiment is aimed to re-use existing device in order to reduce the penalty of incurring additional areas. The transistors of T1 and T2 of BL voltage pull down circuit (e.g. 407) are reused for both the B port 1201 and the A port 1202 including reusing the existing NMOS driver and doubling the alpha ratio while the digital logic gates are added. The doubling of the alpha ratio could be accomplished by, for example, halving the gate resistance of the pull gate transistor (e.g. T11 or T22) relative to the pull up transistor (e.g. T5). The FEWA function is implemented by using one port to perform a write operation while the other idle or unused port is used to provide the FEWA function so that no extra FEWA device is needed. The transistors of T1 and T2 of BL voltage pull down circuit are controlled by a NAND gate which receives an input from the output of a OR gate. The controls of the transistors T1 and T2 are modified from an inverter which is replaced by the above described digital logic gates so as to provide different controls from both sides (i.e. T1 is turned on while T2 is turned off). Assuming that the write path of the A port driver is farther than the write path of the B port driver, the A port driver would maintain the normal write path while the far end B port would play the role of FEWA and assist the A port driver. The opposite would also be true if B port has farther write path which would then be assisted by the far end A port driver.

Figure 13:
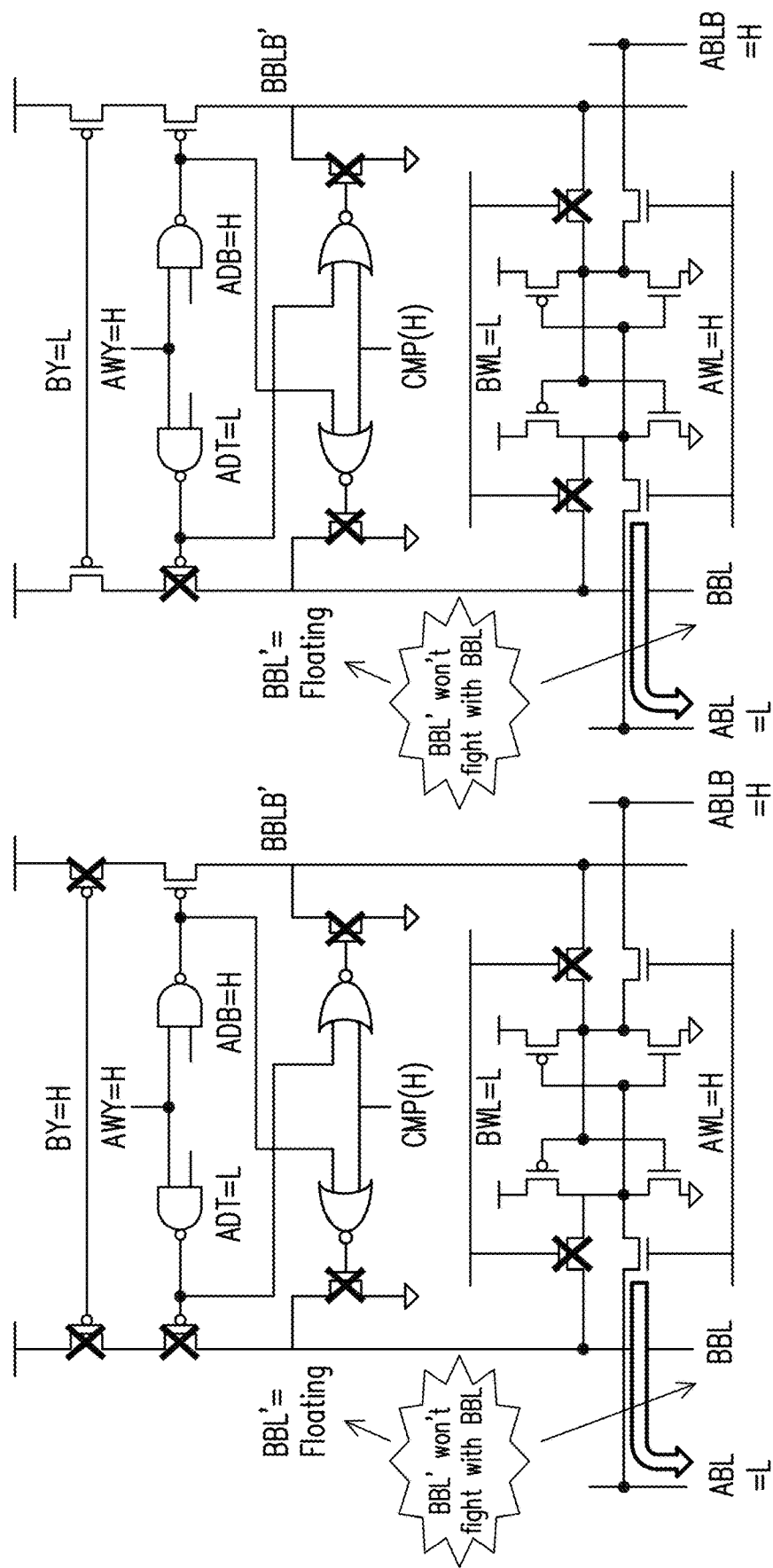
FIG. 13 illustrates a memory circuit operating under a same column different row situation in accordance with an exemplary embodiment of the disclosure.

In addition to the SRDC situation, the memory circuit in this disclosure would also operate under different situations such as same column different row situation as well as different column different row situation. As an exemplary embodiment, FIG. 13 illustrates a memory circuit operating under a same column different row situation. Under such situation, the output of CNT block 702 would output a high signal (i.e. CMP (H)) causing the first transistor to be turned off and thus the previous high voltage would be left floating.

For the BL selection circuit (e.g. 406), the BY signal would be high and thus the first bias transistor T51 and the second bias transistor T52 would both be turned off. The AWY signal would remain high, the ADT signal would remain low, and the ADB signal would remain high causing the third transistor T3 to be turned off and the fourth transistor T4 to be turned on. Moreover, the BWL is set low so that the second WL switch (e.g. 402) is turned off while the AWL is set high so that the first WL switch (e.g. 404) is turned on resulting a write current flowing from the first WL switch to a write driver along the ABL which is set low. In this exemplary embodiment, there is no need for the extra write drive path (e.g. 1801), and the gating of extra write driver by NOR2 would avoid a potential conflict in the BBL.

Figure 14:
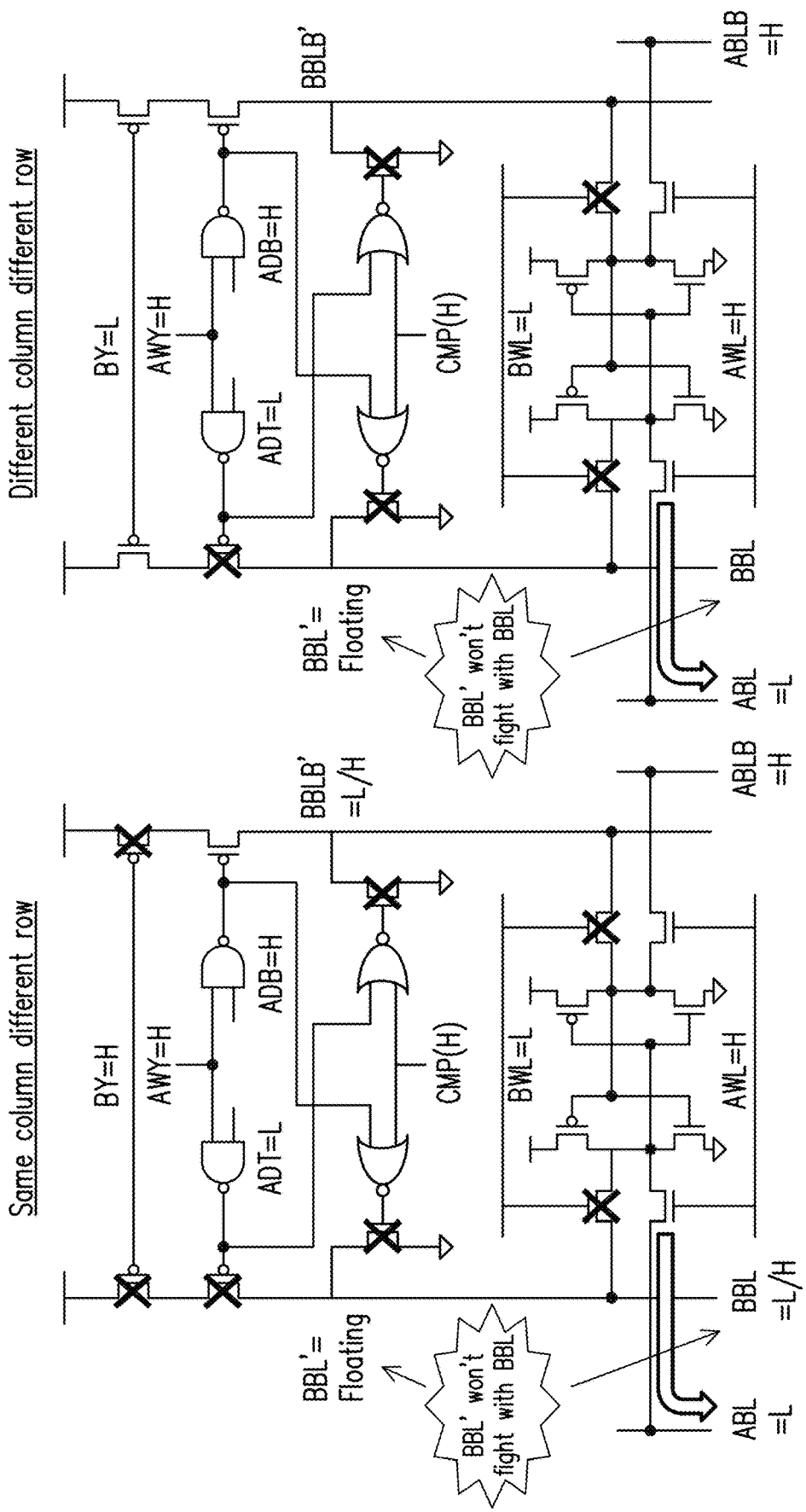
FIG. 14 illustrates a memory circuit operating under a different column different row situation in accordance with an exemplary embodiment of the disclosure.

FIG. 14 illustrates a memory circuit operating under a different column different row situation in accordance with an exemplary embodiment of the disclosure. Under such situation, the output of CNT block 702 would output a high signal (i.e. CMP (H)) causing the first transistor to be turned off and thus the previous high voltage would be left floating. For the BL selection circuit (e.g. 406), the BY signal would be low and thus the first bias transistor T51 and the second bias transistor T52 would both be turned on. The AWY signal would remain high, the ADT signal would remain low, and the ADB signal would remain high causing the third transistor T3 to be turned off and the fourth transistor T4 to be turned on. Moreover, the BWL is set low so that the second WL switch (e.g. 402) is turned off while the AWL is set high so that the first WL switch (e.g. 404) is turned on resulting a write current flowing from the first WL switch to a write driver along the ABL which is set low. In this exemplary embodiment, there is no need for the extra write drive path (e.g. 1801), and the gating of extra write driver by the comparator CMP would avoid a potential conflict in the BBL.

In conclusion, the disclosure provides a memory circuit, a method of minimizing the RDW effect of a memory circuit, and an electronic device thereof.

In an aspect of the disclosure, the memory circuit would include a dual port memory cell for storing a binary value which is accessed through a first port and a second port, a first WL switch connected to the dual port memory cell and controlled by a first WL voltage, a second WL switch connected to the dual port memory cell and controlled by a second WL voltage, a first BL connected to the first WL switch for accessing the memory cell through the first port and having a first BL voltage, a second BL connected to the second WL switch for accessing the memory cell through the second port and having a second BL voltage, a BL selection circuit connected to the second WL switch for selecting the second BL, and a BL voltage pull down circuit connected to the BL selection circuit and the second WL switch and configured to pull down the second BL voltage, wherein during a write operation, the first BL voltage is pulled from high to low, and the BL voltage pull down circuit is configured to pull the second BL voltage from high to low before the second WL voltage is pulled high. The BL voltage pull down circuit is configured to pull the second BL voltage from high to low before the second WL voltage is pulled high further including: the BL voltage pull down circuit is configured to generate a write assist current flowing from the second WL switch to the BL voltage pull down circuit so as to pull the second BL voltage from high to low before the second WL voltage is pulled high. The write assist current generated by the BL voltage pull down circuit is configured to double the pull gate pull up ratio (PG/PU) of the memory cell. During the write operation, a write current of the first port is flowing from the first WL switch to the first BL as the write assist current is flowing from the second WL switch to the BL voltage pull down circuit. The write current of the first port is assisted by an idle transistor from a second port of another column. The SRAM circuit may further include a comparator circuit connected to the BL voltage pull down circuit and configured to receive a first address of the first port and a second address of the second port for determining whether the write operation is a SRDC access based on comparing the first address with the second address. The comparator circuit may include an output which outputs a first binary value to pull the second BL voltage low only in response to the comparator circuit having determined the write operation is the SRDC access, and the comparator outputs a second binary value which leaves the second BL voltage floating in response to the comparator having determined that the write operation is not the DRDC access. The BL voltage pull down circuit may include a first transistor connected to the second WL switch and a third transistor of the BL selection circuit, and a first NOR gate connected to the first transistor, including a first NOR gate input and a second NOR gate input, and is configured to control the first transistor based on a NOR operation between the first NOR gate input and the second NOR gate input, wherein the first NOR gate input is connected to a fourth transistor of the BL selection circuit and the second NOR gate input is connected to the output of the comparator circuit. The BL voltage pull down circuit may further include a second transistor connected to the fourth transistor of the BL selection circuit and a second BL bar switch, and a second NOR gate connected to the first transistor, including a third NOR gate input and a fourth NOR gate input, and is configured to control the second transistor based on a NOR operation between the third NOR gate input and the fourth NOR gate input, wherein the third NOR gate input is connected to the third transistor of the BL selection circuit and the fourth NOR gate input is connected to the output of the comparator circuit. In response to the output of the comparator circuit being the first binary value, the first transistor is turned on to set the second BL voltage low and the second transistor is set floating to set a second BL complement voltage high.

In an aspect of the disclosure, the method of minimizing the read-disturb-write effect of a memory circuit would include providing a comparator circuit which comprises an output indicating a same role different column access according to a first binary value, providing a BL voltage pull down circuit connected to the comparator circuit and receiving the first binary value, and pulling low the second BL voltage, by the BL voltage pull down circuit during a write operation, in response to receiving the first binary value and before a second WL voltage is pulled high, wherein the memory circuit would include the comparator circuit, a dual port memory cell circuit for storing a binary value which is accessed through a first port and a second port, a first WL switch connected to the dual port memory cell and controlled by a first WL voltage, a second WL switch connected to the dual port memory cell and controlled by a second WL voltage, a first bit line (BL) connected to the first WL switch for accessing the memory cell through the first port and having a first BL voltage, a second BL connected to the second WL switch for accessing the memory cell through the second port and having a second BL voltage, a BL selection circuit connected to the second WL switch for selecting the second BL; and a BL voltage pull down circuit connected to the BL selection circuit and the second WL switch. The method may further include generating, by the BL voltage pull down circuit, a write assist current flowing from the second WL switch to the BL voltage pull down circuit so as to pull the second BL voltage from high to low before the second WL voltage is pulled high. Generating the write assist current may further include configuring the write assist current generated by the BL voltage pull down circuit to double the pull gate pull up ratio (PG/PU) of the memory cell. The method may further include generating a write current of the first port to flow from the first WL switch to the first BL as the write assist current is flowing from the second WL switch to the BL voltage pull down circuit and assisting the write current of the first port by using an idle transistor from a second port of another column.

In an aspect of the disclosure, the electronic device would include a central processor, a memory controller coupled to the central processor, and a memory circuit coupled to the memory controller and including a dual port memory cell for storing a binary value which is accessed through a first port and a second port, a first WL switch connected to the dual port memory cell and controlled by a first WL voltage, a second WL switch connected to the dual port memory cell and controlled by a second WL voltage, a first bit line (BL) connected to the first WL switch for accessing the memory cell through the first port and having a first BL voltage, a second BL connected to the second WL switch for accessing the memory cell through the second port and having a second BL voltage, a BL selection circuit connected to the second WL switch for selecting the second BL, a comparator circuit connected to the BL voltage pull down circuit and configured to receive a first address of the first port and a second address of the second port for generating a first binary value in response to having determined that the write operation is a same row different column (SRDC) access based on comparing the first address with the second address, and a BL voltage pull down circuit connected to the BL selection circuit, the comparator circuit, and the second WL switch and configured to pull down the second BL voltage in response to receiving the first binary value, wherein during a write operation, the first BL voltage is pulled from high to low, and the BL voltage pull down circuit is configured to pull the second BL voltage from high to low before the second WL voltage is pulled high. The BL voltage pull down circuit is configured to pull the second BL voltage from high to low before the second WL voltage is pulled high may further include: the BL voltage pull down circuit is configured to generate a write assist current flowing from the second WL switch to the BL voltage pull down circuit so as to pull the second BL voltage from high to low before the second WL voltage is pulled high. The BL voltage pull down circuit may include a first transistor connected to the second WL switch and a third transistor of the BL selection circuit and a first NOR gate connected to the first transistor, including a first NOR gate input and a second NOR gate input, and is configured to control the first transistor based on a NOR operation between the first NOR gate input and the second NOR gate input, wherein the first NOR gate input is connected to a fourth transistor of the BL selection circuit and the second NOR gate input is connected to the output of the comparator circuit. The BL voltage pull down circuit may further include a second transistor connected to the fourth transistor of the BL selection circuit and a second BL bar switch, and a second NOR gate connected to the first transistor, comprising a third NOR gate input and a fourth NOR gate input, and is configured to control the second transistor based on a NOR operation between the third NOR gate input and the fourth NOR gate input, wherein the third NOR gate input is connected to the third transistor of the BL selection circuit and the fourth NOR gate input is connected to the output of the comparator circuit. In response to the output of the comparator circuit being the first binary value, the first transistor is turned on to set the second BL voltage low and the second transistor is set floating to set a second BL complement voltage high.

In view of the aforementioned descriptions, the disclosure is suitable for being used in a memory device and would improve the state-of-the-art technology by minimizing the RDW effect of a memory device.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A memory circuit comprising:
   a dual port memory cell for storing a binary value which is accessed through a first port and a second port;
   a first word line (WL) switch connected to the dual port memory cell and controlled by a first WL voltage;
   a second WL switch connected to the dual port memory cell and controlled by a second WL voltage;
   a first bit line (BL) connected to the first WL switch for accessing the memory cell through the first port and having a first BL voltage;
   a second BL connected to the second WL switch for accessing the memory cell through the second port and having a second BL voltage;
   a BL selection circuit connected to the second WL switch for selecting the second BL; and
   a BL voltage pull down circuit connected to the BL selection circuit and the second WL switch and configured to pull down the second BL voltage, wherein during a write operation of both the first port and the second port to the dual port memory cell, the first BL voltage is pulled from high to low as the first WL voltage is pulled high which occurs before the second WL is pulled high, and the BL voltage pull down circuit is configured to pull the second BL voltage from high to low before the second WL voltage is pulled high.

2. The memory circuit of claim 1, wherein the BL voltage pull down circuit is configured to pull the second BL voltage from high to low before the second WL voltage is pulled high further comprising:
   the BL voltage pull down circuit is configured to generate a write assist current flowing from the second WL switch through the second BL to the BL voltage pull down circuit so as to pull the second BL voltage from high to low before the second WL voltage is pulled high.

3. The memory circuit of claim 2, wherein the write assist current generated by the BL voltage pull down circuit is configured to double the pull gate pull up ratio (PG/PU) of the memory cell.

4. The memory circuit of claim 2, wherein during the write operation, a write current of the first port is flowing from the first WL switch to the first BL as the write assist current is flowing from the second WL switch to the BL voltage pull down circuit.

5. The memory circuit of claim 4, wherein the write current of the first port is assisted by an idle transistor from the second port which is a same row different column (SRDC) as the first port.

6. The memory circuit of claim 1 further comprising:
a comparator circuit connected to the BL voltage pull down circuit and configured to receive a first address of the first port and a second address of the second port for determining whether the write operation is a same row different column (SRDC) access based on comparing the first address with the second address.

7. The memory circuit of claim 6, wherein the comparator circuit comprising an output which outputs a first binary value to pull the second BL voltage low only in response to the comparator circuit having determined the write operation is the SRDC access, and the comparator outputs a second binary value which leaves the second BL voltage floating in response to the comparator having determined that the write operation is not the DRDC access.

8. The memory circuit of claim 7, wherein the BL voltage pull down circuit comprising:
a first transistor connected to the second WL switch and a third transistor of the BL selection circuit; and
a first NOR gate connected to the first transistor, comprising a first NOR gate input and a second NOR gate input, and is configured to control the first transistor based on a NOR operation between the first NOR gate input and the second NOR gate input, wherein the first NOR gate input is connected to a fourth transistor of the BL selection circuit and the second NOR gate input is connected to the output of the comparator circuit.

9. The memory circuit of claim 8, wherein the BL voltage pull down circuit further comprising:
a second transistor connected to the fourth transistor of the BL selection circuit and a second BL bar switch; and
a second NOR gate connected to the first transistor, comprising a third NOR gate input and a fourth NOR gate input, and is configured to control the second transistor based on a NOR operation between the third NOR gate input and the fourth NOR gate input, wherein the third NOR gate input is connected to the third transistor of the BL selection circuit and the fourth NOR gate input is connected to the output of the comparator circuit.

10. The memory circuit of claim 9, wherein in response to the output of the comparator circuit being the first binary value, the first transistor is turned on to set the second BL voltage low and the second transistor is set floating to set a second BL complement voltage high.

11. A method of minimizing the read-disturb-write effect of a memory circuit, the method comprising:
providing a comparator circuit which comprises an output indicating a same role different column access according to a first binary value;
providing a BL voltage pull down circuit connected to the comparator circuit and receiving the first binary value;
pulling low a first BL voltage during a write operation of both the first port and the second port to the dual port memory cell as a first WL voltage is pulled high which occurs before a second WL voltage is pulled high; and
pulling low a second BL voltage, by the BL voltage pull down circuit during the write operation, in response to receiving the first binary value after the first WL voltage is pulled high and before the second WL voltage is pulled high, wherein the memory circuit comprising:
the comparator circuit;
a dual port memory cell for storing a binary value which is accessed through a first port and a second port;
a first word line (WL) switch connected to the dual port memory cell and controlled by the first WL voltage;
a second WL switch connected to the dual port memory cell and controlled by the second WL voltage;
a first bit line (BL) connected to the first WL switch for accessing the memory cell through the first port and having a first BL voltage;
a second BL connected to the second WL switch for accessing the memory cell through the second port and having the second BL voltage;
a BL selection circuit connected to the second WL switch for selecting the second BL; and
a BL voltage pull down circuit connected to the BL selection circuit and the second WL switch.

12. The method of claim 11 further comprising:
generating, by the BL voltage pull down circuit, a write assist current flowing from the second WL switch through the second BL to the BL voltage pull down circuit so as to pull the second BL voltage from high to low before the second WL voltage is pulled high.

13. The method of claim 12, wherein generating the write assist current further comprising:
configuring the write assist current generated by the BL voltage pull down circuit to double the pull gate pull up ratio (PG/PU) of the memory cell.

14. The method of claim 13 further comprising:
generating a write current of the first port to flow from the first WL switch to the first BL as the write assist current is flowing from the second WL switch to the BL voltage pull down circuit.

15. The method of claim 14 further comprising:
assisting the write current of the first port by using an idle transistor from a second port which is a same row different column (SRDC) as the first port.

16. An electronic device comprising:
a central processor;
a memory controller coupled to the central processor; and
a memory circuit coupled to the memory controller and comprising:
a dual port memory cell for storing a binary value which is accessed through a first port and a second port;
a first word line (WL) switch connected to the dual port memory cell and controlled by a first WL voltage;
a second WL switch connected to the dual port memory cell and controlled by a second WL voltage;
a first bit line (BL) connected to the first WL switch for accessing the memory cell through the first port and having a first BL voltage;

a second BL connected to the second WL switch for accessing the memory cell through the second port and having a second BL voltage;

a BL selection circuit connected to the second WL switch for selecting the second BL;

a comparator circuit connected to the BL voltage pull down circuit and configured to receive a first address of the first port and a second address of the second port for generating a first binary value in response to having determined that the write operation is a same row different column (SRDC) access based on comparing the first address with the second address; and a BL voltage pull down circuit connected to the BL selection circuit, the comparator circuit, and the second WL switch and configured to pull down the second BL voltage in response to receiving the first binary value, wherein during a write operation of both the first port and the second port to the dual port memory cell, the first BL voltage is pulled from high to low as the first WL voltage is pulled high which occurs before the second WL is pulled high, and the BL voltage pull down circuit is configured to pull the second BL voltage from high to low before the second WL voltage is pulled high.

17. The electronic device of claim 16, wherein the BL voltage pull down circuit is configured to pull the second BL voltage from high to low before the second WL voltage is pulled high further comprising:

the BL voltage pull down circuit is configured to generate a write assist current flowing from the second WL switch through the second BL to the BL voltage pull down circuit so as to pull the second BL voltage from high to low before the second WL voltage is pulled high.

18. The electronic device of claim 17, wherein the BL voltage pull down circuit comprising:

a first transistor connected to the second WL switch and a third transistor of the BL selection circuit; and a first NOR gate connected to the first transistor, comprising a first NOR gate input and a second NOR gate input, and is configured to control the first transistor based on a NOR operation between the first NOR gate input and the second NOR gate input, wherein the first NOR gate input is connected to a fourth transistor of the BL selection circuit and the second NOR gate input is connected to the output of the comparator circuit.

19. The electronic device of claim 18, wherein the BL voltage pull down circuit further comprising:

a second transistor connected to the fourth transistor of the BL selection circuit and a second BL bar switch; and a second NOR gate connected to the first transistor, comprising a third NOR gate input and a fourth NOR gate input, and is configured to control the second transistor based on a NOR operation between the third NOR gate input and the fourth NOR gate input, wherein the third NOR gate input is connected to the third transistor of the BL selection circuit and the fourth NOR gate input is connected to the output of the comparator circuit.

20. The electronic device of claim 19, wherein in response to the output of the comparator circuit being the first binary value, the first transistor is turned on to set the second BL voltage low and the second transistor is set floating to set a second BL complement voltage high.

* * * * *